United States Patent

[11] 3,571,761

[72] Inventors Samuel Mason Meek
Long Beach;
Frederick Bluemel, Belmont, Calif.
[21] Appl. No. 820,824
[22] Filed May 1, 1969
[45] Patented Mar. 23, 1971
[73] Assignee Hughes Aircraft Company
Culver City, Calif.

[54] TRANSISTORIZED AMPLITUDE MODULATION CIRCUIT WITH CURRENT CONTROL
6 Claims, 1 Drawing Fig.

[52] U.S. Cl. .......... 332/31, 307/264, 330/20, 332/43, 332/63
[51] Int. Cl. .......... H03c 1/44
[50] Field of Search .......... 332/31, 31 (T), 48, 43 (B), 43, 44, 45, 60, 64, 63, 49; 307/264, 297; 330/20

[56] References Cited

UNITED STATES PATENTS

| | | | |
|---|---|---|---|
| 2,644,925 | 7/1953 | Koros | 332/31(T) |
| 3,166,722 | 1/1965 | Reid | 332/63X |
| 3,260,966 | 7/1966 | Murray | 332/31(T) |
| 3,469,212 | 9/1969 | Karl et al. | 332/43(B)X |

*Primary Examiner*—Alfred L. Brody
*Attorneys*—James K. Haskell and Paul M. Coble

ABSTRACT: In the disclosed amplitude modulation circuit an RF carrier signal is applied via a filter to the base electrode of a linearly amplifying transistor, the modulated output signal passing through a filter coupled to the transistor collector electrode. A pair of current control transistors coupled in parallel and connected to the emitter electrode of the amplifying transistor are employed to vary the level of current flow through the amplifying transistor in accordance with an audio frequency modulating signal applied via a transformer between the base and emitter electrodes of each current control transistor.

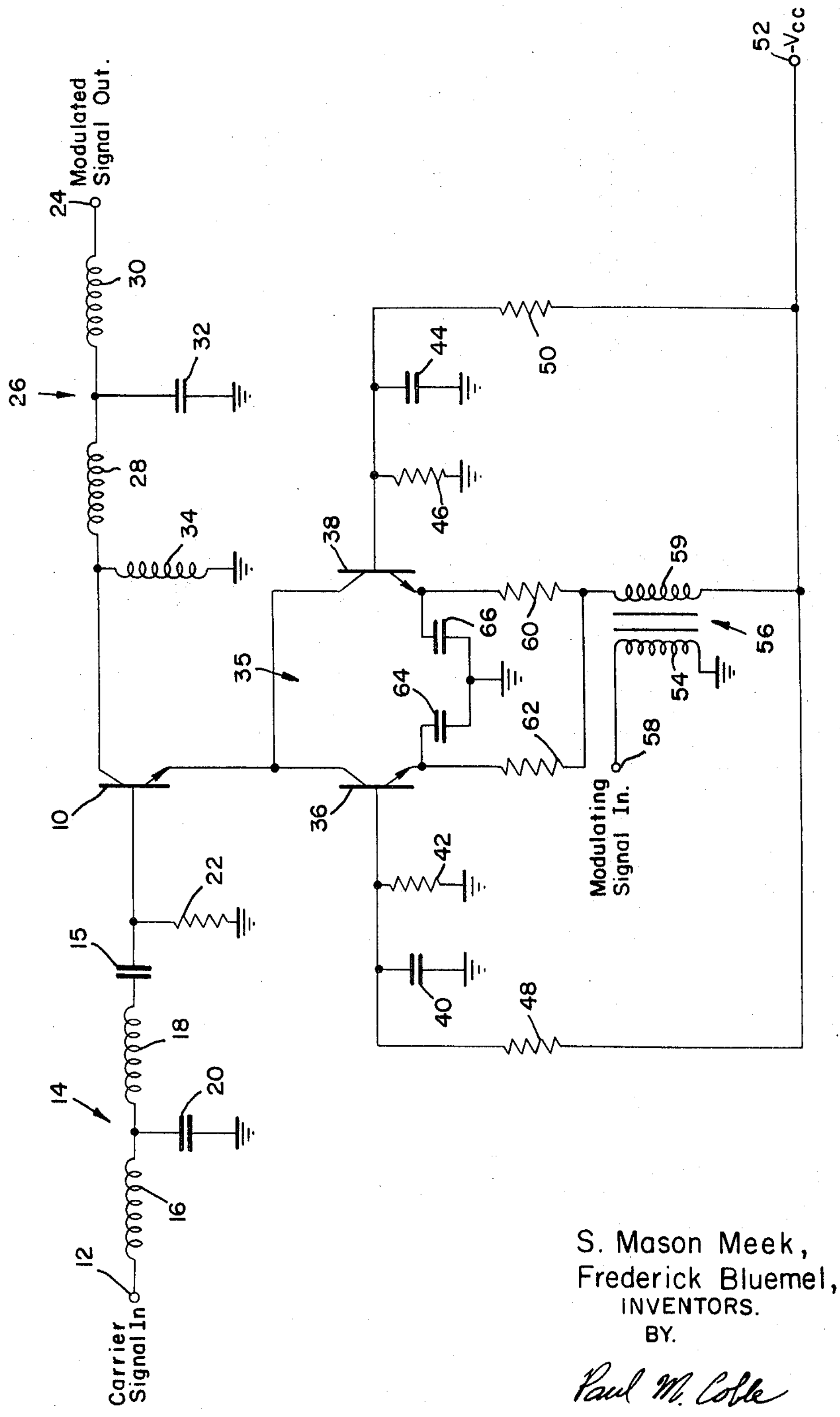
S. Mason Meek,
Frederick Bluemel,
INVENTORS.
BY.
Paul M. Coble
ATTORNEY.

TRANSISTORIZED AMPLITUDE MODULATION CIRCUIT WITH CURRENT CONTROL

This invention relates to amplitude modulation, and more particularly relates to a transistorized amplitude modulation circuit including an amplifying transistor and at least one current control transistor.

The invention herein described was made in the course of or under a Contract or Subcontract thereunder with the United States Air Force.

In typical transistorized amplitude modulation circuits of the prior art, a carrier voltage is applied to the base electrode of a linearly amplifying transistor, and the transistor gain is varied in accordance with a modulating voltage applied to the transistor base or collector electrode. In such circuits certain parameters of the amplifying transistor, such as impedance levels and feed through capacitance, vary as a function of changes in the applied carrier voltage. As a result, the modulation factor varies as a function of the carrier signal amplitude. Moreover, such circuits have relatively narrow bandwidths and are unable to provide a modulation factor approaching unity unless a plurality of modulating transistor stages are employed.

Another type of prior art amplitude modulation circuit is the diode ring modulator in which a plurality of diodes (typically four) are connected in a bridgelike ring and are switched between conducting and nonconducting states by the modulating signal. Although diode ring modulators are operable over wider frequency ranges and can handle more power than the aforementioned transistor modulators, they produce a higher insertion loss. In addition, the modulation factor of the diode ring modulator varies as a function of the carrier signal amplitude.

Accordingly, it is an object of the present invention to provide a simple and reliable amplitude modulation circuit which affords a modulation factor essentially independent of carrier signal amplitude.

It is a further object of the present invention to provide a transistor amplitude modulation circuit which is operable over a substantially wider frequency range than transistor amplitude modulation circuits of the prior art.

It is a still further object of the present invention to provide a transistorized amplitude modulation circuit which additionally can achieve an essentially unity modulation factor with a single modulating transistor stage, and in which the modulated output signal contains minimum harmonic distortion.

In accordance with the above objects, an amplitude modulation circuit according to the invention includes an amplifying transistor. An input carrier signal is applied to the base electrode of this transistor via a first filter network, and the modulated output signal appearing at the second filter network. A semiconductor amplifying device is coupled to the emitter electrode of the transistor for varying the current flow through its collector-emitter path in accordance with a modulating signal.

Additional objects, advantages and characteristic features of the invention will become readily apparent from the following detailed description of a preferred embodiment of the invention when considered in conjunction with the accompanying drawing in which the sole figure is a schematic circuit diagram illustrating a preferred amplitude modulation circuit according to the invention.

Referring to the FIGURE with greater particularity, a circuit according to the invention may be seen to be constructed around a single modulating transistor 10. The transistor 10 is normally biased for Class A amplification and may be a 2N4429 transistor, for example, although other transistors are equally suitable. A radio frequency carrier signal may be applied to the circuit between carrier input terminal 12 and a reference level illustrated as ground, an exemplary carrier frequency being 400 MHz. Coupled in series between carrier input terminal 12 and the base electrode of transistor 10 are a first filter network 14 and a coupling capacitor 15. The filter 14 may include inductors 16 and 18 coupled in series between terminal 12 and capacitor 15, and a capacitor 20 coupled between the junction between inductors 16 and 18 and the ground level. The filter network 14 is tuned to a frequency greater than the sum of the highest carrier and modulation frequencies to be processed in the circuit. For example, for a carrier frequency of 400 MHz the filter 14 may be tuned to a frequency of 405 MHz. A bias resistor 22 is coupled between the base electrode of transistor 10 and ground.

Coupled between the collector electrode of transistor 10 and an output terminal 24 at which the modulated output signal from the circuit is provided is a second filter network 26. Filter 26, which is similar to filter 14 and which may be tuned to the same frequency as filter 14, includes inductors 28 and 30 coupled in series between the collector electrode of transistor 10 and terminal 24, and a capacitor 32 coupled between the junction between inductors 28 and 30 and ground. An inductor 34 is coupled between the collector electrode of transistor 10 and the ground level in order to provide a power supply voltage return for the collector of transistor 10.

A semiconductor amplifying arrangement 35 is coupled to the emitter electrode of the transistor 10 in order to vary the current flow through the collector-emitter path of transistor 10 in accordance with a modulating input voltage. In the circuit illustrated, arrangement 35 comprises a pair of current control transistors 36 and 38 having their collector electrodes directly connected together and to the emitter electrode of modulating transistor 10. Each of the transistors 36 and 38 may be the aforementioned 2N4429 transistor, for example, although it is pointed out that transistors 36 and 38 need not be the same as transistor 10 or even the same as each other. The base electrode of transistor 36 is grounded through RF bypass capacitor 40 and parallel bias resistor 42, while the base electrode of transistor 38 is similarly grounded through RF bypass capacitor 44 and parallel bias resistor 46. Bias resistors 48 and 50 are coupled between the respective base electrodes of transistors 36 and 38 and a power supply terminal 52 supplying a voltage $-V_{cc}$ which may be −28 volts, for example. It is pointed out that although the circuit of the invention is illustrated as employing NPN transistors driven from a negative supply, PNP transistors are also suitable, in which case a positive supply voltage would be employed.

An audio frequency modulating voltage, which typically may be at a frequency of 1 kc., for example, is applied across primary winding 54 of a an audio frequency transformer 56. Primary winding 54 is coupled between modulating signal input terminal 58 and the ground level. Secondary winding 59 of the transformer 56 is resistively coupled between the respective emitter electrodes of transistors 36 and 38 and power supply terminal 52. In the specific arrangement shown, the terminal of secondary winding 59 remote from terminal 52 is coupled via a resistor 60 to the emitter electrode of transistor 38 and via a resistor 62 to the emitter electrode of transistor 36. The emitter electrodes of transistors 36 and 38 are coupled to ground through respective capacitors 64 and 66.

In the operation of the amplitude modulation circuit of the invention, transistor 10 is normally biased at an intermediate conductive level in its linear amplification region. In the absence of a modulating input signal at terminal 58, current control transistors 36 and 38 are conductive at a current level intermediate cutoff and saturation. The radio frequency carrier signal applied to terminal 12 is amplified by transistor 10 and passed to output terminal 24.

When a modulating signal is applied to terminal 58, the level of current flow through the collector-emitter paths of transistors 36 and 38 is varied at the modulating signal frequency, and since this current also flows through the collector-emitter path of transistor 10, the current flow through the transistor 10 varies at the modulating signal frequency. In particular, when the modulating signal at terminal 58 changes in a positive direction, transistors 36 and 38 become more heavily conductive of current, thereby lowering the impedance presented to current flowing in the emitter path of transistor 10. As a result, increased current flows through transistor 10, and the voltage at the collector electrode of transistor 10 increases accordingly. When the modulating signal applied to terminal 58 changes in a negative direction, current flow through transistors 36 and 38 decreases, thereby increasing the impedance in the emitter path of transistor 10. Current flow through transistor 10 then decreases, producing a decreasing voltage at the collector electrode of transistor 10. Thus, the carrier signal passed to output terminal 24 becomes modulated with the envelope of the modulating signal applied to terminal 58.

Since the current flow through the collector-emitter path of transistor 10 is varied without changing transistor parameters such as impedance levels and feedthrough capacitance, as essentially constant modulation factor is achieved with the circuit of the invention regardless of changes in the carrier signal amplitude. .Moreover, a modulation factor of essentially unity is afforded with only a single modulating transistor stage, and at the same time operation over an extremely wide range of carrier frequencies, for example, an octave or greater, is readily obtainable.

It is further pointed out that the power handling capability of the circuit of the invention can be readily altered by coupling a different number of current control transistors such as 36 and 38 in parallel. While the illustrated two-transistor arrangement is preferred, only a single current control transistor is necessary when the circuit power requirements are low, while three or more such transistors may be employed for higher power requirements.

Thus, although the present invention has been shown and described with reference to a particular embodiment, nevertheless various changes and modifications obvious to one skilled in the art are deemed to lie within the purview of the invention.

We claim:

1. An amplitude modulation circuit comprising:

an amplifying transistor having an emitter electrode, a base electrode and a collector electrode; first filter means coupled to the base electrode of said transistor for applying an input carrier signal thereto; second filter means coupled to the collector electrode of said transistor for deriving a modulated output signal therefrom; a current control transistor having an emitter electrode, a base electrode and a collector electrode, the collector-emitter path of said current control transistor being coupled in series with the collector-emitter path of said em amplifying transistor; and means for applying a modulating signal between the base and emitter electrodes of said current control transistor.

2. An amplitude modulation circuit according to claim 1 wherein said means for applying a modulating signal includes an audio frequency transformer having a primary winding for receiving an input modulating signal and having a secondary winding resistively coupled between the base and emitter electrodes of said current control transistor.

3. An amplitude modulation circuit according to claim 1 wherein the collector electrode of said current control transistor is directly connected to the emitter electrode of said amplifying transistor.

4. An amplitude modulation circuit comprising:

an amplifying transistor having an emitter electrode, a base electrode and a collector electrode; first filter means coupled to the base electrode of said transistor for applying an input carrier signal thereto; second filter means coupled to the collector electrode of said transistor for deriving a modulated output signal therefrom; a plurality of current control transistors each having an emitter electrode, a base electrode and a collector electrode, the respective collector-emitter paths of said current control transistors being coupled in parallel with one another and in series with the collector-emitter path of said amplifying transistor; and means for applying a modulating signal between the base and emitter electrodes of each of said current control transistors.

5. An amplitude modulation circuit according to claim 4 wherein the respective collector electrodes of said current control transistors are directly connected to one another and to the emitter electrode of said amplifying transistor.

6. An amplitude modulation circuit comprising:

an amplifying transistor having an emitter electrode, a base electrode and a collector electrode; first filter means coupled to the base electrode of said transistor for applying an input carrier signal thereto; second filter means coupled to the collector electrode of said transistor for deriving a modulated signal therefrom; first and second current control transistors each having an emitter electrode, a base electrode and a collector electrode, the respective collector electrodes of said first and second transistors being connected together and to the emitter electrode of said amplifying transistor; first and second resistors coupled in series between the respective emitter electrodes of said first and second current control transistors; an audio frequency transformer having a primary winding and a secondary winding, one terminal of said secondary winding being coupled to the junction between said first and second resistors; means for applying a modulating signal across said primary winding; a third resistor coupled between the base electrode of said first current control transistor and another terminal of said secondary winding; a fourth resistor coupled between the base electrode of said second current control transistor and said another terminal of said secondary winding; and means for applying a DC voltage between the collector electrode of said amplifying transistor and said another terminal of said secondary winding.

PO-1050
(5/69)

UNITED STATES PATENT OFFICE
CERTIFICATE OF CORRECTION

Patent No. 3,571,761 Dated March 23, 1971

Inventor(s) Samuel Mason Meek and Frederick Bluemel

It is certified that error appears in the above-identified patent and that said Letters Patent are hereby corrected as shown below:

Col. 1, line 53, after "the" insert --collector electrode of t transistor is passed through a--.
Col. 3, line 16, "as" (second occurrence) should be --an--.
line 48, delete "em".

Signed and sealed this 26th day of October 1971

(SEAL)
Attest:

EDWARD M.FLETCHER,JR.
Attesting Officer

ROBERT GOTTSCHALK
Acting Commissioner of Patents